(12) United States Patent
Atwater, Jr. et al.

(10) Patent No.: US 7,341,927 B2
(45) Date of Patent: Mar. 11, 2008

(54) WAFER BONDED EPITAXIAL TEMPLATES FOR SILICON HETEROSTRUCTURES

(75) Inventors: Harry A. Atwater, Jr., So. Pasadena, CA (US); James M. Zahler, Pasadena, CA (US); Anna Fontcubera I Morral, Paris (FR)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 11/004,808

(22) Filed: Dec. 7, 2004

(65) Prior Publication Data

US 2005/0142879 A1 Jun. 30, 2005

Related U.S. Application Data

(63) Continuation of application No. 10/784,586, filed on Feb. 23, 2004, now abandoned, and a continuation-in-part of application No. 10/761,918, filed on Jan. 20, 2004, now Pat. No. 7,238,622, which is a continuation-in-part of application No. 10/125,133, filed on Apr. 17, 2002, now Pat. No. 7,019,339.

(60) Provisional application No. 60/526,332, filed on Dec. 2, 2003, provisional application No. 60/284,726, filed on Apr. 17, 2001.

(51) Int. Cl.
*H01L 21/322* (2006.01)
(52) U.S. Cl. .................. 438/473; 438/483; 257/E21.09
(58) Field of Classification Search ................ 438/473, 438/483, 495, 453; 257/E21.09, E21.085, 257/E21.122
See application file for complete search history.

(56) References Cited

U.S. PATENT DOCUMENTS 4,474,647 A 10/1984 Asselineau et al.

(Continued)

FOREIGN PATENT DOCUMENTS

EP 0 060 103 4/1985

(Continued)

OTHER PUBLICATIONS

Weldon et al., "Mechanism of Silicon Exfoliation Induced by Hydrogen/Helium Co-Implantation," Applied Physics Letters, vol. 73, No. 25, Dec. 21, 1998, pp. 3721-3723.

(Continued)

*Primary Examiner*—Caridad Everhart
(74) *Attorney, Agent, or Firm*—Foley & Lardner LLP

(57) ABSTRACT

A heterostructure device layer is epitaxially grown on a virtual substrate, such as an InP/InGaAs/InP double heterostructure. A device substrate and a handle substrate form the virtual substrate. The device substrate is bonded to the handle substrate and is composed of a material suitable for fabrication of optoelectronic devices. The handle substrate is composed of a material suitable for providing mechanical support. The mechanical strength of the device and handle substrates is improved and the device substrate is thinned to leave a single-crystal film on the virtual substrate such as by exfoliation of a device film from the device substrate. An upper portion of the device film exfoliated from the device substrate is removed to provide a smoother and less defect prone surface for an optoelectronic device. A heterostructure is epitaxially grown on the smoothed surface in which an optoelectronic device may be fabricated.

21 Claims, 9 Drawing Sheets

U.S. PATENT DOCUMENTS

| | | | |
|---|---|---|---|
| 4,499,327 | A | 2/1985 | Kaiser |
| 4,679,942 | A | 7/1987 | Suwa et al. |
| 5,013,681 | A | 5/1991 | Godbey et al. |
| 5,090,977 | A | 2/1992 | Strack et al. |
| 5,217,564 | A | 6/1993 | Bozler et al. |
| 5,231,047 | A | 7/1993 | Ovshinsky et al. |
| 5,315,793 | A * | 5/1994 | Peterson et al. ............... 451/2 |
| 5,336,841 | A | 8/1994 | Adams |
| 5,374,564 | A | 12/1994 | Bruel |
| 5,391,257 | A | 2/1995 | Sullivan et al. |
| 5,395,788 | A * | 3/1995 | Abe et al. .................. 438/690 |
| 5,609,734 | A | 3/1997 | Streicher et al. |
| 5,637,187 | A | 6/1997 | Takasu et al. |
| 5,641,381 | A | 6/1997 | Bailey et al. |
| 5,710,057 | A | 1/1998 | Kenney |
| 5,720,929 | A | 2/1998 | Minkkinen et al. |
| 5,877,070 | A | 3/1999 | Goesele et al. |
| 5,882,987 | A * | 3/1999 | Srikrishnan ................. 438/458 |
| 5,910,699 | A * | 6/1999 | Namba et al. .............. 310/320 |
| 5,914,433 | A | 6/1999 | Marker |
| 6,020,252 | A | 2/2000 | Aspar et al. |
| 6,103,597 | A | 8/2000 | Aspar et al. |
| 6,121,504 | A | 9/2000 | Kuechler et al. |
| 6,150,239 | A | 11/2000 | Goesele et al. |
| 6,221,738 | B1 | 4/2001 | Sakaguchi et al. |
| 6,242,324 | B1 | 6/2001 | Kub et al. |
| 6,251,754 | B1 | 6/2001 | Ohshima et al. |
| 6,323,108 | B1 | 11/2001 | Kub et al. |
| 6,328,796 | B1 | 12/2001 | Kub et al. |
| 6,346,458 | B1 | 2/2002 | Bower |
| 6,429,104 | B1 | 8/2002 | Auberton-Herve |
| 6,465,327 | B1 | 10/2002 | Aspar et al. |
| 6,489,241 | B1 * | 12/2002 | Thilderkvist et al. ....... 438/689 |
| 6,497,763 | B2 | 12/2002 | Kub et al. |
| 6,504,091 | B2 | 1/2003 | Hisamatsu et al. |
| 6,737,670 | B2 * | 5/2004 | Cheng et al. ................. 257/19 |
| 6,794,276 | B2 | 9/2004 | Letertre et al. |
| 6,815,309 | B2 | 11/2004 | Letertre et al. |
| 6,867,067 | B2 | 3/2005 | Ghyselen et al. |
| 6,908,828 | B2 | 6/2005 | Letertre et al. |
| 7,019,339 | B2 | 3/2006 | Atwater, Jr. et al. |
| 2003/0064535 | A1 | 4/2003 | Kub et al. |
| 2004/0235268 | A1 | 11/2004 | Letertre et al. |
| 2005/0026432 | A1 | 2/2005 | Atwater, Jr. et al. |
| 2005/0032330 | A1 | 2/2005 | Ghyselen et al. |
| 2005/0085049 | A1 | 4/2005 | Atwater, Jr. et al. |
| 2005/0275067 | A1 | 12/2005 | Atwater, Jr. et al. |

FOREIGN PATENT DOCUMENTS

| | | |
|---|---|---|
| JP | 60-165719 A | 8/1985 |
| JP | 60-178629 A | 9/1985 |
| JP | 03-270220 | 2/1991 |
| WO | WO 01/03172 | 1/2001 |

OTHER PUBLICATIONS

U.S. Appl. No. 10/761,918, filed Jan. 20, 2004, Atwater et al.
U.S. Appl. No. 10/784,586, filed Feb. 23, 2004, Atwater et al.
U.S. Appl. No. 11/004,948, filed Dec. 7, 2004, Atwater et al.
U.S. Appl. No. 11/430,160, filed May 9, 2006, Atwater, Jr. et al.
Curtis et al., "Integration of the UOP/HYDRO MTO Process into Ethylene Plants," 10th Ethylene Producers' Conference, 1998, pp. 54-85.
Bett et al., III-V Compounds for Solar Cell Applications, Appl. Phys. A, 1999, pp. 119-129, vol. 69, Springer-Verlag (published online: Jun. 24, 1999).
Bruel et al., Smart-Cut: A New Silicon On Insulator Material Technology Based on Hydrogen Implantation and Wafer Bonding, Mar. 1997, pp. 1636-1641, vol. 36, Jpn. J. Appl. Phys.
Cheng et al., Electron Mobility Enhancement in Strained-SI n-MOSFETs Fabricated on SiGe-on-Insulator (SGOI) Substrates, IEEE Electron Device Letters, Jul. 2000, pp. 321-323, vol. 22, No. 7.
Dobaczewski et al., Donor Level of Bond-Center Hydrogen in Germanium, Physical Review B, 2004, pp. 245207-1-6, vol. 69.
Georgakilas et al., Wafer-scale Integration of GaAs Optoelectronic Devices with Standard SI Integrated Circuits Using a Low-Temperature Bonding Procedure, Applied Physics Letters, Dec. 2002, pp. 5099-5101, vol. 81, No. 27, American Institute of Physics [Downloaded Oct. 19, 2004].
Gösele et al., Fundamental Issues in Wafer Bonding, J. Vac. Sci. Technol. A, Jul./Aug. 1999, pp. 1145-1152, vol. 17(4), American Vacuum Society.
Gösele et al., Semiconductor Wafer Bonding. Annu. Rev. Mater. Sci., 1998, pp. 215-241, vol. 28.
Huang et al., SiGe-on-Insulator Prepared by Wafer Bonding and Layer Transfer for High-Performance Field-Effect Transistors, Applied Physics Letters, Feb. 2001, pp. 1267-1269, vol. 78, No. 9, American Institute of Physics.
Tong et al., "Layer Splitting Process in Hydrogen-Implanted Si, Ge, SiC, and Diamond Substrates," Appl. Phys. Lett., vol. 70, No. 11, Mar. 17, 1997, pp. 1390-1392.
Huang et al., Electron and Hole Mobility Enhancement in Strained SOI by Water Bonding, IEEE Transactions on Electron Devices, Sep. 2002, pp. 1566-1571, vol. 49, No. 9.
Langdo et al., Strained Si on Insulator Technology: From Materials to Devices, Solid-State Electronics, 2004, pp. 1357-1367, vol. 48, Elsevier Ltd.
Leroy et al., Controlled Surface Nanopatterning with Buried Dislocation Arrays, Surface Science, 2003, pp. 211-219, vol. 545, Elsevier B.V.
Ma et al., Solid-State Reaction-Mediated Low-Temperature Bonding of GaAs and InP Wafers to Si Substrates, Appl. Phys. Lett., Feb. 1994, pp. 772-774, vol. 64, No. 6, American Institute of Physics.
Maleville et al., Smart-Cut® Technology: From 300 mm Ultrathin SOI Production to Advanced Engineered Substrates, Solid-State Electronics, 2004, pp. 1055-1063, vol. 48, Elsevier Ltd.
Morral et al., InGaAs/InP Double Heterostructures on InP/Si Templates Fabricated by Wafer Bonding and Hydrogen-Induced Exfoliation, Applied Physics Letters, Dec. 2003, pp. 5413-5415, vol. 83, No. 26, American Institute of Physics.
Tong et al., Wafer Bonding and Layer Splitting for Microsystems, Adv. Mater., 1999, pp. 1409-1425, vol. 11, No. 17, Wiley-VCH Verlag GmbH.
Tong et al., Layer Splitting Process in Hydrogen-Implanted Si, Ge, SiC, and Diamond Substrates, Appl. Phys. Letter, Mar. 1997, pp. 1390-1392, vol. 70, No. 11, American Institute of Physics.
Tong et al., Hydrophobic Silicon Wafer Bonding, Appl. Phys. Lett., Jan. 1994, pp. 625-627, vol. 64, No. 5, American Institute of Physics.
Tong et al., A "Smarter-Cut" Approach to Low Temperature Silicon Layer Transfer, Appl. Phys. Lett., Jan. 1998, pp. 49-51, vol. 72, No. 1, American Institute of Physics.
Zahler et al., Ge Layer Transfer to Si for Photovoltaic Applications, Thin Solid Films, 2002, pp. 558-562, vol. 403-404, Elsevier Science B.V.
Zahler et al., Wafer Bonding and Layer Transfer Processes for 4-Junction High Efficiency Solar Cells, 29th IEEE Photovoltaic Specialists Conference, New Orleans, USA, (May 2002).
Auberton-Hervé et al., Smart-Cut® : The Basic Fabrication Process for UNIBOND® SOI Wafers, IEICE Trans. Electron, Mar. 1997, pp. 358-363, vol. E80-C, No. 3, The Institute of Electronics, Information and Communication Engineers.
Tracy et al., Germanium-on-Insulator Substrates by Wafer Bonding, Journal of Electronic Materials, 2004, pp. 886-892, vol. 33, No. 8.
Zahler et al., J. Electron Mater., 33(8), (2004), pp. 22-23, (Abstracts K2 and K3).
Akatsu et al., Wafer Bonding of Different III-V Compound Semiconductors by Atomic Hydrogen Surface Cleaning, Journal of Applied Physics, Oct. 2001, pp. 3858-3862, vol. 90, No. 8, American Institute of Physics.

Bruel M., Silicon on Insulator Material Technology, Electronics Letters, Jul. 1995, pp. 1201-1202, vol. 31, No. 14.

Bruel M., Application of Hydrogen Ion Beams to Silicon on Insulator Material Technology, Nuclear Instruments and Methods in Physics Research B, 1996, pp. 313-319, vol. 108, Elsevier Science B.V.

Kim et al., Heterogeneous Silicon Integration by Ultra-High Vacuum Wafer Bonding, Journal of Electronic Materials, 2003, pp. 849-854, vol. 32, No. 8.

Lagnado et al., Integration of Si and SiGe with $Al_2O_3$ (sapphire), Microelectronic Engineering, 2001, pp. 455-459, vol. 59, Elsevier Science B.V.

Taraschi et al., Strained SI, SiGe and Ge On-Insulator: Review of Wafer Bonding Fabrication Techniques, Solid-State Electronics, 2004, pp. 1297-1305, vol. 48, Elsevier Ltd.

Wiegand et al., Wafer Bonding of Silicon Wafers Covered with Various Surface Layers, Sensors and Actuators, 2000, pp. 91-95, vol. 86, Elsevier Science B.V.

Yamaguchi M., Multi-Junction Solar Cells and Novel Structures for Solar Cell Applications, Physica E, 2002, pp. 84-90, vol. 14, Elsevier Science B.V.

Zahler et al., Wafer Bonded Ga/Si Heterostructures for Photovoltaic Applications, Presentation, MRS 2002 Fall Meeting, 16 pages, (Nov. 2002).

Zahler et al., Wafer Bonded Ge/Si Heterostructures for Photovoltaic Applications, (Presentation), Electronic Materials Conference 2002, 16 pages.

Zahler et al., Wafer Bonded Ge/Si Heterostructures for Photovoltaic Applications, (Abstract and Presentation, MRS 2002 Spring Meeting (Apr. 2002).

Zahler J.M., Materials Integration by Wafer Bonding and Layer Transfer, (Presentation), 13 pages, MRS 2004 Spring Meeting (Apr. 2004).

Zahler et al., The Role of H in the H-Induced Exfoliation of GE Films, (Abstract and Presentation), MRS 2004 Spring Meeting, 16 pages (Apr. 2004).

Zahler et al., Wafer Bonded Expitaxial Templates for GaAs/Si Heterostructures, (Abstract and Presentation), MRS 2003 Spring Meeting, 16 pages, (Apr. 2003).

Zahler et al., Wafer Bonded Expitaxial Templates for GaAs/Si and InP/Si Heterostructures, (Presentation), MRS 2003 Fall Meeting, 15 pages, (Nov. 2003).

Zahler et al., Wafer Bonding Processes for Ultrahigh Efficiency Photovoltaic Applications, (Abstract and Presentation), MRS 2001 Fall Meeting, (Nov. 2001).

Zahler et al., GE Layer Transfer to Si for Photovoltaic Applications, (Presentation), 14 pages, MRS 2001 Spring Conference, (Apr. 2001).

Zahler et al., Wafer Bonding and Layer Transfer Processes for A 4-Junction Solar Cell, (Presentation) 29th IEEE Photovoltaic Specialists Conference, New Orleans, USA, (May 2002).

Zahler et al., Ge/Si Wafer Bonded Epitaxial Templates for GaAs/Si Heterostructures, (Abstract), MRS 2002 Fall Meeting, (Nov. 2002).

Morral et al., Bonding and Layer Transfer Process of InP on Silicon for the Elaboration of the Botton Double Heterostructure of 4-Junction High Efficiency Solar Cells, (Abstract), MRS 2002 Fall Meeting, (Nov. 2002).

Morral et al., Assessment of Optical and Structural Properties of III-V Semiconductors Grown on InP/Si and Ge/Si Wafer Bonded Epitaxial Templates with Application to a Four-Junction Solar Cell, (Abstract), MRS 2003 Spring Meeting, (Apr. 2003).

Morral et al., Electrical and Structural Characterization of the Interface of Wafer Bonded InP/SI, MRS 2003 Spring Meeting, (Apr. 2003).

Morral et al., The Role of Hydrogen In H-Induced Exfoliation and Layer Transfer on InP, (Abstract), MRS 2004 Spring Meeting, (Apr. 2004).

* cited by examiner

WAFER BONDED EPITAXIAL TEMPLATES FOR SILICON HETEROSTRUCTURES

RELATED APPLICATIONS

The present application is related to U.S. Provisional Application Ser. No. 60/526,332, filed on Dec. 2, 2003 and is a continuation-in-part application related under 35 USC 120 to copending U.S. patent application Ser. No. 10/761,918 filed on Jan. 20, 2004 which in turn was a continuation-in-part application of application Ser. No. 10/125,133 filed on Apr. 17, 2002 now U.S. Pat. No. 7,019,339, and which in turned claimed priority to U.S. Provisional Patent Application Ser. No. 60/284,726, filed on Apr. 17, 2001 which claimed priority pursuant to 35 USC 119, each which related applications are incorporated herein by reference.

FEDERAL SUPPORT STATEMENT

This invention was made with government support under Contract No. DE-AC36-99G010337, Midwest Research Institute Subcontract No. ACQ-1-30619-13 awarded by the Department of Energy and Contract No. NAS3-02201, Subcontract No. 200492; LEW-17946-1 awarded by NASA. The government has certain rights in the invention.

BACKGROUND OF THE INVENTION

1. Field of the Invention

The invention relates to the field of semiconductor processing of films and in particular to processing nonsilicon films.

2. Description of the Prior Art

The optoelectronics, photovoltaics, telecommunications, and LED industries have a need for a substrate technology that allows them to use a low-cost readily available substrate like Si as a mechanical support for a thin film of optoelectronic material on which to fabricate a device. Some obvious advantages are improved mechanical strength and superior thermal conductivity relative to a bulk optoelectronic material.

Group III–V semiconductor layered structures grown on bulk germanium substrates have been used in the prior art to create high efficiency triple-junction solar cells with efficiencies greater than 30%. However, these are prohibitively expensive for all but space applications, because the Ge substrate constitutes a large portion of this cost.

The optoelectronics, photovoltaics, telecommunications, and LED industries would benefit from adopting a substrate technology that allows them to use a low-cost readily available substrate like Si as a mechanical support for a thin film of optoelectronic nonsilicon material on which to fabricate a device. Some obvious advantages are improved mechanical strength and superior thermal conductivity relative to a bulk optoelectronic material.

BRIEF SUMMARY OF THE INVENTION

The invention is an improvement in a method of epitaxially growing heterostructures on a virtual substrate comprised of an optoelectronic device substrate and handle substrate. The method comprises the step of initiating bonding of the device substrate to the handle substrate. The device substrate is composed of a material suitable for fabrication of optoelectronic devices therein and the handle substrate is composed of an inexpensive material suitable for providing mechanical support. The mechanical strength of the bond between device and handle substrates is improved. The device substrate is thinned to leave a single-crystal film on the virtual substrate such as by exfoliation of a device film from the device substrate. An upper portion of the device film exfoliated from the device substrate is removed to provide a smoother and less defect prone surface is provided for subsequent optoelectronic device fabrication. The heterostructure is epitaxially grown on the smoothed surface.

In the illustrated embodiment the device substrate is InP/Si and the step of epitaxially growing the heterostructure on the smoothed surface comprises the step of epitaxially growing a photoluminescent InP/InGaAs/InP double heterostructure on the smoothed surface.

The step of removing an upper portion of the device film exfoliated from the device substrate comprises chemically polishing the upper portion with a damage selective etch, or mechanically polishing the upper portion.

Where the device and handle substrates present a InP/Si interface, the chemically polishing the upper portion with a damage selective etch comprises the step of etching with a mixture of $HCl:H_3PO_4:H_2O_2$ used in ratios of 1:2:2 or 1:2:4.

In another embodiment the step of mechanically polishing the upper portion comprises using a colloidal silica slurry in a sodium hypochlorite solution.

The invention is also defined as an improvement in a heterostructure device layer which is epitaxially grown on a virtual substrate. The improvement comprises a device substrate and a handle substrate from which the virtual substrate is formed. The device substrate is bonded to the handle substrate and is composed of a material suitable for fabrication of optoelectronic devices. The handle substrate is composed of a material suitable for providing mechanical support. The mechanical strength of the bond between device and handle substrates is improved and the device substrate is thinned to leave a single-crystal film on the virtual substrate such as by exfoliation of a device film from the device substrate. An upper portion of the device film exfoliated from the device substrate is removed to provide a smoother and less defect prone surface for an optoelectronic device. A heterostructure is epitaxially grown on the smoothed surface in which an optoelectronic device may be fabricated.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1:
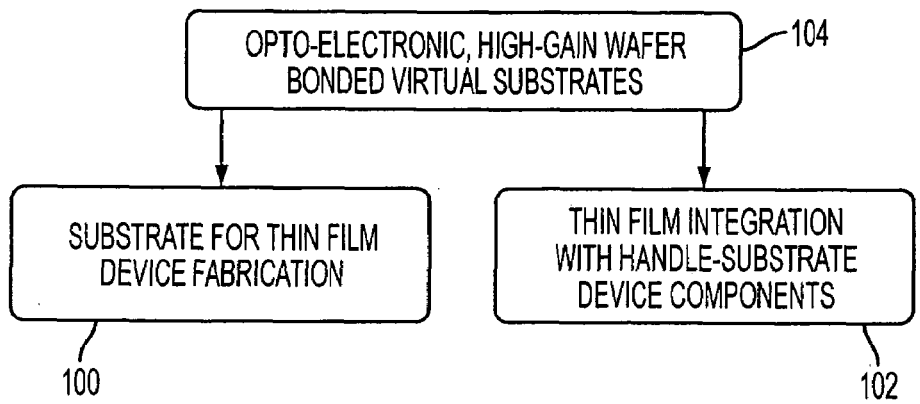
FIG. 1 is a block diagram illustrating two alternative fabrication strategies for a virtual substrate.

The fabrication 104 of virtual wafer bonded substrates could take two possible approaches as diagrammatically illustrated in the block diagram of FIG. 1. These approaches are the integration of a thin device film with a bulk substrate prior to fabricating a functional device indicated by block 100, or the device film can be transferred to the handle substrate following the fabrication of a functional logic device in the handle substrate and/or the fabrication of a functional optoelectronic device in the optoelectronic device substrate as depicted by block 102.

This specification summarizes a number of embodiments of the fabrication of optoelectronic virtual substrates. We begin with a summary of the technology generally employed and device structures for which the virtual substrate product can be used. Next, more material process steps are described in the order that they appear in the fabrication process.

Process and Product Overview

For the purpose of the specification the term "device substrate" 10 is the optoelectronic substrate from which a thin film 12 will be removed. The term "handle substrate" 14 is defined in the specification to refer to the substrate that is used as a mechanical support for the device film 12, namely the remainder of device substrate 10 after removal of film 12. The term "virtual substrate" 16 is defined to be the completed structure of a thin device film 12 on a handle substrate 14.

Figure 2:
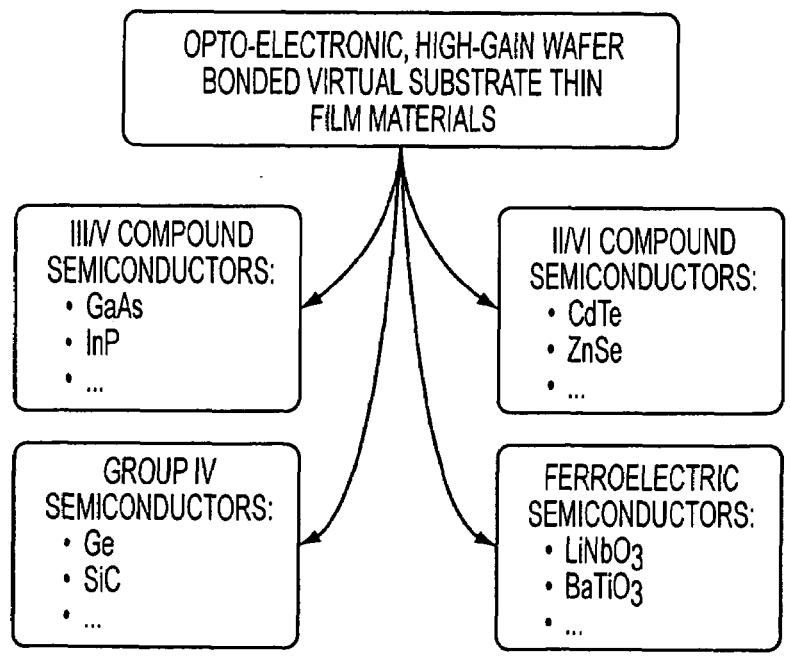
FIG. 2 is a block diagram illustrated categories of film materials which are used for a virtual substrate according to the invention.

The materials of interest for device substrate 10 for the discussion below can be considered all materials that are relevant to wafer bonded virtual substrate device film materials for opto-electronic, high-gain device fabrication as illustrated diagrammatically in FIG. 2: these include, but are not limited to III/IV compound semiconductors (i.e. GaAs, InP, GaN, etc.), II/VI semiconductors (i.e. CdTe, etc.), group TV semiconductors (i.e. Ge for GaAs family growth), and optically important Ferroelectric oxides (i.e. $LiNbO_4$, $BaTiO_4$, etc.).

The handle substrate 14 will generally be Si, which is abundantly available and has desirable electrical, mechanical, and thermal properties. Hence, a heterostructure with Si can be made according to the teachings and spirit of the invention with any of the materials in the preceding paragraph. However, low-cost insulating substrates (i.e. glass, sapphire, etc.) might also be employed as handle substrate 14.

Figure 3A:
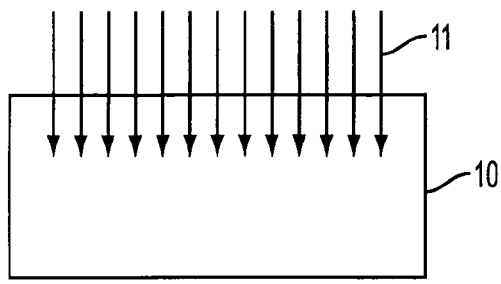
FIGS. 3a and 3b are diagrams illustrating respectively the ion implantation and the resulting structure in the device substrate.

A generic process for fabricating such virtual substrates 16 comprises the following steps:

1) The device substrate 10 and handle substrate 14 may need pre-bonding treatment to allow for the removal of a thin film 12 (e.g., ion-implantation into device substrate 10 as diagrammatically depicted by number 11 in FIG. 3a).

Figure 4A:
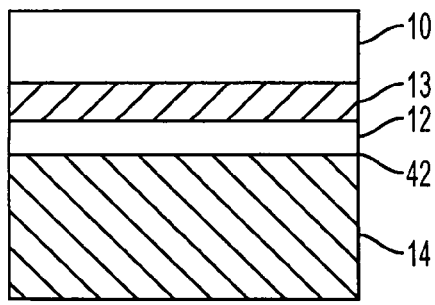
FIGS. 4a and 4b are diagrams illustrating respectively the device and handle substrate stack following ion implantation and initial bonding and the wafer bonded virtual substrate following the anneal and layer exfoliation.
Figure 4B:
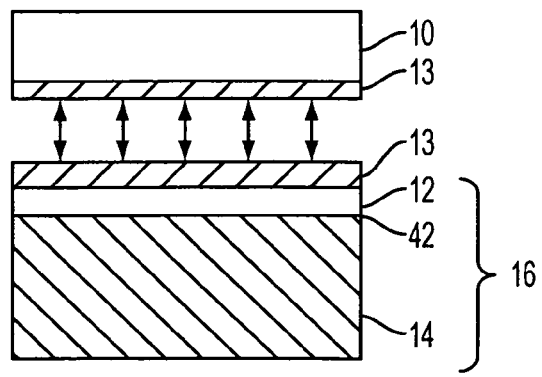
Figure 5A:
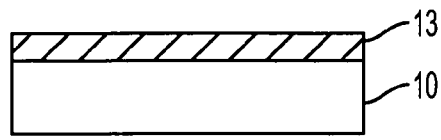
FIGS. 5a and 5b are diagrams illustrating respectively the post-layer transfer device substrate comprised of the near surface ion implantation damage layer and the undamaged bulk, and the removal of the damage by etching from the bulk device substrate allowing the process to be repeated.
Figure 5B:
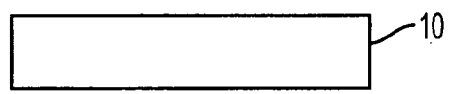

2) The device substrate 10 is cleaned and/or passivated to facilitate bonding.
3) Bonding is initiated as diagrammatically shown in FIG. 4a.
4) The bond 42 is strengthened.
5) The device substrate 10 is thinned to leave a single-crystal film 12 on the finished virtual substrate 16 as shown in FIG. 4b for an ion-implanted substrate.
6) In the case of ion implantation induced layer exfoliation, the device substrate 10 from which the device film 12 was derived can be reprocessed by a means of surface polishing to allow the reuse of the substrate 10 to transfer another device film as illustrated in FIG. 5a and FIG. 5b.

Consider the concepts used for the fabrication of optoelectronic virtual substrates 16. These will be listed in the order in which they would appear in the generic process described above.

Process Steps

1) Ion Implantation

Figure 3B:
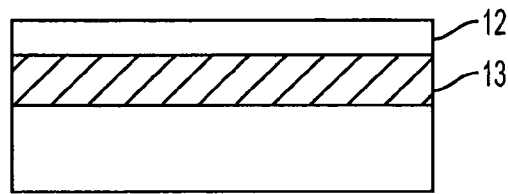

Prior to bonding, ion implantation of the device substrate 10 is performed to inject a necessary amount of gas species into the substrate to form the internally passivated surfaces and internal pressure necessary to exfoliate a layer from the substrate upon annealing as diagrammatically depicted in FIG. 3a, which illustrates pre-bonding ion implantation of the device substrate 10 with an ion beam 11, creating a modified structure as shown in FIG. 3b comprising a device thin film 12, an ion damaged layer for film transfer 13, and the largely unaffected bulk of the device substrate 10 which is now called the handle substrate 14.

This process is generally performed with $H^+$ or a combination of $H^+$ and $He^+$. However, other gas species may be employed to produce an intra-substrate etch process to assist in the exfoliation of the layer. For a given device substrate material there is both a minimum implantation temperature to avoid amorphization and a needed implantation temperature, namely a minimum required dose relationship for this process.

a. $H^+$ Implantation—A sufficient dose of $H^+$ is implanted to allow film exfoliation upon annealing. This dose is a function of:
    Implant energy
    Implant temperature
    Device substrate material
    Film exfoliation anneal temperature b. $H^+/He^+$ Co-implantation—A sufficient total dose of $H^+$ and $He^+$ is implanted to allow film exfoliation upon annealing. The concept of this approach being that the H plays a chemical role of passivating internal surfaces, while the chemically inert He efficiently migrates to internal surfaces to provide pressure, and creates more damage per implanted ion than H increasing the internal surface density. The necessary dose is a function of:
    Implant energy
    Implant temperature
    H/He ratio
    Device substrate material
    Film exfoliation anneal temperature c. Etchant implantation—In addition to or replacement of $H^+$ implantation, chemical species known to etch a given material can be implanted to create internally trapped chemical species that are volatile and cause exfoliation upon annealing. The chemical species chosen will be material specific according to known etchant properties or empirical experience.

2) Surface Passivation

Following implantation and prior to bonding, it is necessary to passivate the surface of both the device and handle substrates 10, 14 to allow hydrophobic wafer bonding. The specific chemical process necessary is device substrate specific. The purpose of this step is to enable the formation of an intimate covalent bond between the device film 12 and handle substrate 14 in the finished virtual substrate 16 allowing for the possibility of ohmic, low-resistance interface electrical properties. A necessary step in enabling this finished device structure will be the elimination of adsorbed water on the surface by means of a low temperature bake in an inert atmosphere or in vacuum. The bake should reach a temperature such that the vapor pressure of water at that temperature is well above the partial pressure of water in the surrounding ambient.

a. Group IV Passivation—The Group IV elemental semiconductors, particularly Ge, are rendered hydrophobic by the use of a dilute HF etching process. This leaves a predominantly hydride terminated surface.

b. Group III/V Passivation—The Group III/V compound semiconductors can be rendered hydrophobic by compound-specific chemical treatments to leave a hydrophobically passivated surface for bonding.

c. Group II/VI Passivation—The Group II/VI compound semiconductors can be rendered hydrophobic by compound-specific chemical treatments to leave a hydrophobically passivated surface for bonding.

d. Ferroelectric Oxides—Applications involving ferroelectric oxides are fundamentally different than those for the optoelectronic materials from the elemental and compound semiconductors. For this reason handle substrate materials will be chosen for their electrical and refractive properties, but there will generally be no need to attempt hydrophobic wafer bonding to the insulating ferroelectric thin films. Thus, surface passivation will generally focus on forming a thin oxide on both the device and handle substrates 10, 14.

3) Surface Modification

Figure 6A:
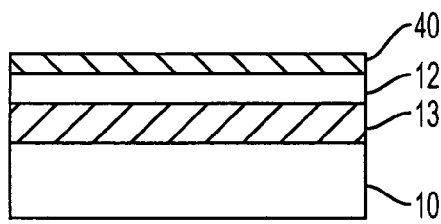
FIGS. 6a and 6b are diagrams illustrating respectively the surface modification of the implanted device substrate with either a film of the same chemical identity as the handle substrate, and a wafer bonded substrate stack using this technique showing the device substrate.
Figure 6B:
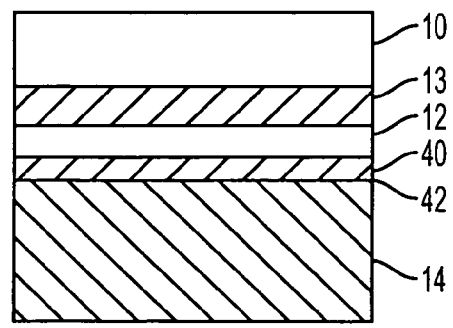

Another enabling technology for extending this process to a wide range of optoelectronic materials is the use of a deposited surface modification layer 40 of arbitrary thickness to change the nature of the physical interaction between the substrates 10, 14 as depicted in FIGS. 6a and 6b. This can be done in one of three ways, where X stands for any type of composition compatible with the disclosed method:

a. Deposition of a layer 40 of material X on the device substrate 10 to enable an X-handle material bond.

b. Deposition of a layer 40 of material X on the handle substrate 14 to enable an X-device material bond.

c. Deposition of a layer 40 of material X on both substrates to enable an X—X bond.

This technology enables the integration of a wide range of optoelectronic materials by mastering bonding with a material which is compatible or amenable to the disclosed process, which for the moment is referenced simply as material X. The generic process is illustrated in FIGS. 6a and 6b. FIG. 6a illustrates the surface modification of the implanted device substrate with either a crystalline or amorphous film 40 of the same chemical identity as the handle substrate 14. FIG. 6b illustrates a wafer bonded substrate stack using this technique showing the device substrate 10, the ion implanted damage region 13, the device thin film 12, the deposited bond mediating film 40, the bonded interface 42, and the handle substrate 14.

More specific applications of this technique are:
d. Epitaxial Si bonding layer—This technique involves epitaxially growing a strained thin film of Si on the device substrate material. In this embodiment material X is strained thin film Si. Through doing this an intimate and maximally strong bond can be ensured between the device material and the Si epitaxial layer. The device substrate 10 with the strained Si epitaxy is then implanted through the epitaxial layer (not shown) in preparation for wafer bonding and layer exfoliation. For material systems utilizing Si handle substrates 14 this would allow direct Si—Si wafer bonding using well established passivation techniques.
e. Amorphous Si bonding layer—This technique involves depositing a thin layer of amorphous Si (not shown) at low temperature on the device substrate 10 to enable the use of typical Si surface preparation chemistries. In this embodiment material X is amorphous Si. This process could be performed either prior to or after ion implantation of the device substrate 10. For material systems utilizing Si handle substrates 14 this would allow direct Si—Si wafer bonding using well established passivation techniques.

4) Particle Removal

Following surface passivation, it may be necessary to remove residual particle contamination on the bonding surfaces of the device and handle substrates 10 and 14. This has been efficiently done by performing a clean with a $CO_2$ particle jet as depicted in FIGS. 4a and 4b. FIG. 4a is a diagram of a device substrate 10 and handle substrate 14 stack following ion implantation and initial bonding, showing the undamaged bulk device substrate 10, the ion implanted damage layer 13, the device thin film 12, the wafer bonded device/handle interface 42, and the handle substrate 14. FIG. 4b is a diagram showing the wafer bonded virtual substrate 16 following the anneal and layer exfoliation, and showing the undamaged bulk device substrate 10 with its ion implanted damaged surface region 13. Also shown is the wafer bonded virtual substrate 16 comprised of the ion implantation damaged surface region 13 of the device film 12, the undamaged transferred device film 12, the wafer bonded interface 42, and the handle substrate 14. The substrates 10 and/or 14 are held at an elevated temperature and a throttled gas/particle jet of $CO_2$ is impinged on the surface of substrates 10, 14 removing particles by a combined physical impact and thermophoretic lifting effect.

This has been demonstrated for Si, Ge, and InP by maintaining the substrates at a temperature greater than 50° C. during application of the $CO_2$.

5) Elevated Temperature Bond Initiation

When bonding dissimilar materials there is generally a coefficient of thermal expansion mismatch between the two materials resulting in a temperature-dependent strain state of the device thin film 12 in the virtual substrate 16 that is governed by the equation $$\gamma(T) = \int_{T_0}^{T} \Delta\alpha(T')dT'$$

where $\Delta\alpha(T)$ is the difference in the thermal expansion coefficients a between the two substrates as a function of temperature, T, and where $T_0$ is the temperature of the zero strain condition, typically assumed to be the bond initiation temperature. Thus, by controlling the temperature at which two substrates are brought into contact, the strain state at temperatures of interest can be engineered. This could be advantageous for improving substrate performance in high-temperature processes, or a device operation temperature strain could be engineered to adjust a key device property such as bandgap or carrier mobility. The following descriptions describe the general types of strain temperature-strain dependences that could be achieved as a function of the sign of $\Delta\alpha(T)$.

$$\Delta\alpha(T)=\alpha_{handle}(T)-\alpha_{device}(T)$$

Figure 7:
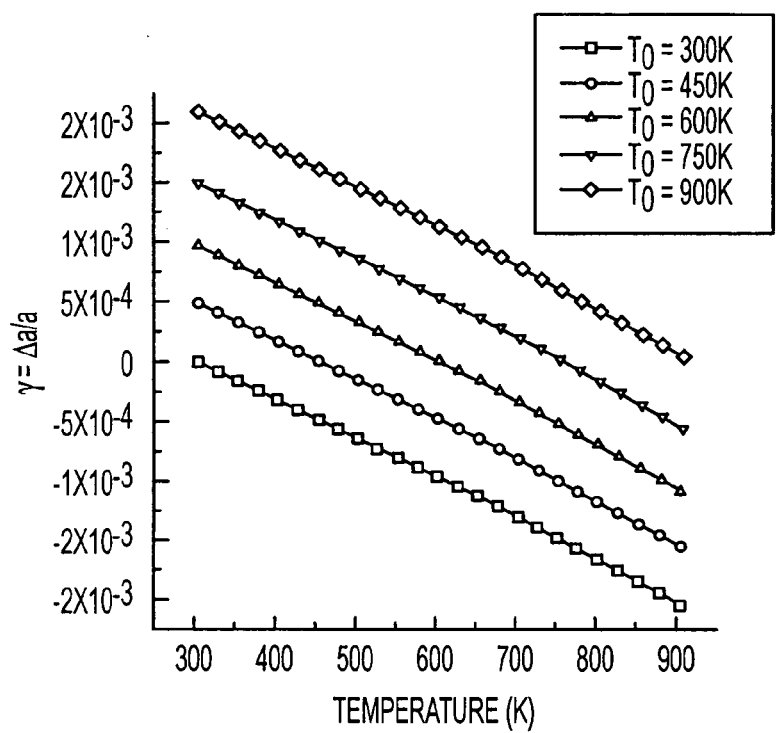
FIG. 7 is a graph of the strain state as a function of temperature for a Ge/Si wafer bonded virtual substrate.
Figure 8:
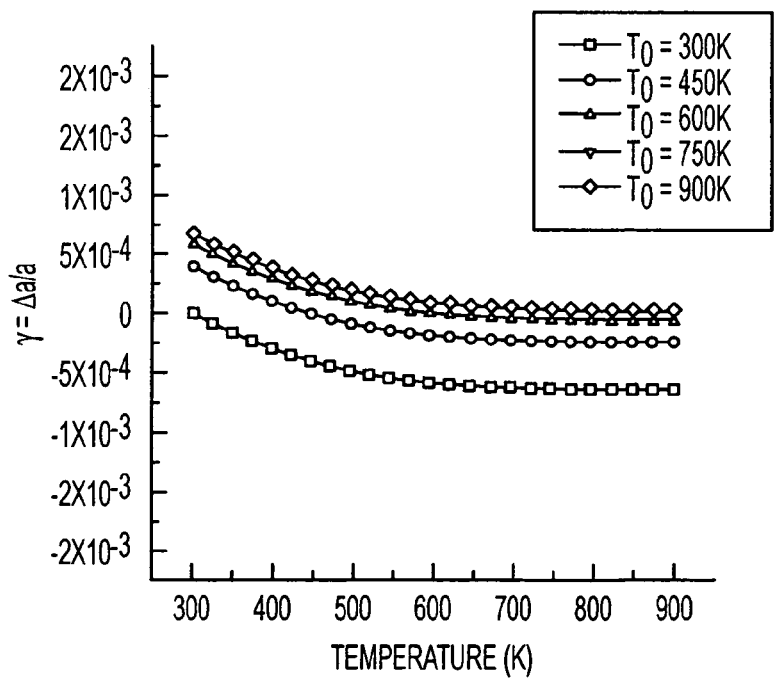
FIG. 8 is a graph of the strain state as a function of temperature for an InP/Si wafer bonded virtual substrate.
Figure 9:
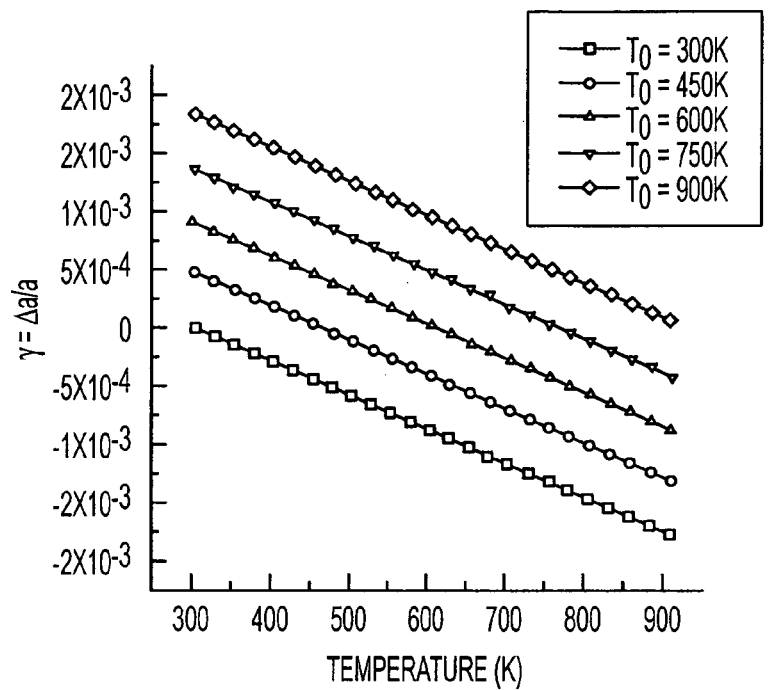
FIG. 9 is a graph of the strain state as a function of temperature for a GaAs/Si wafer bonded virtual substrate.

Such that positive values of strain indicate a film in tension and negative values of strain indicate a film in compression.

a. $\Delta\alpha(T)>0$:
1. Room Temperature Bonding—In this case the film 12 will be in tension at elevated processing temperatures. This will lead to changes in the lattice matching in heteroepitaxy on the virtual substrate 16 and a tendency to concave substrate bowing.
2. Elevated Temperature Bonding—In this case the film will have a zero strain condition at the bonding temperature such that tensile strain and concave wafer bowing will be reduced at higher processing temperatures. Likewise, the film 12 will be in compressive strain at room temperature and likely at device operating temperatures leading to convex wafer bow. This could change device operation and enable design of novel devices based on strain control of materials parameters.

b. $\Delta\alpha(T)<0$:
1. Room Temperature Bonding—In this case the film will be in compression at elevated temperatures. This will lead to changes in the lattice matching in heteroepitaxy on the virtual substrate and a tendency to convex substrate bowing.
2. Elevated Temperature Bonding—In this case the film 12 will have a zero strain condition at the bonding temperature such that compressive strain and convex bowing will be reduced at higher processing temperatures. Likewise, the film 12 will be in tensile strain at room temperature and likely at device operating temperatures leading to concave wafer bow. This could change device operation and enable design of novel devices based on strain control of materials parameters. Most materials of interest for the wafer bonded virtual substrates 16 described belong to this category.
   a. Ge/Si Bonding—FIG. 7 is a graph which illustrates the predicted strain in Ge/Si bonding as a function of temperature for substrates bonded at various values of $T_0$. The film compression at high temperatures can be reduced by initiation bonding at higher temperatures, $T_0$.
   b. InP/Si Bonding—FIG. 8 is a graph which illustrates the predicted strain in InP/Si bonding as a function of temperature for substrates bonded at various values of $T_0$. Again, the film compression at high temperatures can be reduced by initiation bonding at higher temperatures, $T_0$.
   c. GaAs/Si Bonding—FIG. 9 is a graph which illustrates the predicted strain in GaAs/Si bonding as a function of temperature for substrates bonded at various values of $T_0$. Once again, the film compression at high temperatures can be reduced by initiation bonding at higher temperatures, $T_0$.

6) Dissimilar Temperature Bond Initiation

For some desired engineered stain states, no single elevated bond temperature will enable the fabrication of that device. Likewise, for materials with very similar coefficients of thermal expansion strain engineering will be difficult. To further enable control of strain at a desired temperature, bonding could be initiated between substrates held at different temperatures. In this way, the thermo-mechanical strain state could be more freely controlled or artificially built into the finished structure. In this case the temperature dependent strain state is given by $$\gamma(T) = \int_{T_0}^{T} \Delta\alpha(T')dT' + \gamma_0$$

where the value $y_0$ is the strain built into the bonded structure upon bond initiation and is given by $$\gamma_0 = \int_{T_0}^{T_d} \alpha_d(T')dT' + \int_{T_h}^{T_0} \alpha_h(T')dT'$$

In this expression, $T_d$ and $T_h$ are the temperatures of the device substrate 10 and the handle substrate 14 respectively at the instant of bond initiation. The temperature $T_0$ is the effective bond initiation temperature. The dissimilar temperatures of the substrates at bond initiation make this term difficult to determine. $T_0$ must have a value between $T_d$ and $T_h$ and will depend upon the experimental apparatus used in fabrication of the virtual substrate 16 and can be determined experimentally. The built-in strain approaches $$\gamma_0 = \int_{T_h}^{T_d} \alpha(T')dT'$$

for device and handle substrates 10, 14 with very similar coefficients of linear expansion. Bonding at different wafer temperatures can be conducted in the following circumstances.

a. $\Delta\alpha(T)>0$:
  1. $T_d>T_h$—These conditions enable the addition of a positive stress component causing the device film to be under increased tension at elevated temperatures.
  2. $T_d<T_h$—These conditions enable the addition of a negative stress component reducing the high temperature tensile stress, but creating a greater low temperature compressive stress.

b. $\Delta\alpha(T)<0$:
  1. $T_d>T_h$—These conditions enable the addition of a positive stress component causing the device film to be under a reduced degree of compressive stress at high temperatures.
  2. $T_d<T_h$—These conditions enable the addition of a negative stress component increasing the high temperature compressive stress, but creating a reduced low temperature tensile stress.

c. $\Delta\alpha(T)=0$:
  1. $T_d>T_h$—A temperature independent tensile stress can be imparted on the device film in this way.
  2. $T_d<T_h$—A temperature independent compressive stress can be added to the device film.

7) Annealing Under Pressure to Strengthen Bonding and Exfoliate the Device Layer After the device and handle substrates 10, 14 have been bonded, it is necessary to use a thermal cycle to improve bond strength and to activate the ion implantation layer transfer process. By performing this cycle under pressure, thermo-mechanical strain can be accommodated in the bonded bulk substrate stack. Additionally, bonding is strengthened by means of improved substrate-substrate contact. A bonding process using multiple pressure-temperature steps or even a continuously varying pressure-temperature curve can be used to optimize the effectiveness of pressure in the process.

Figure 10:
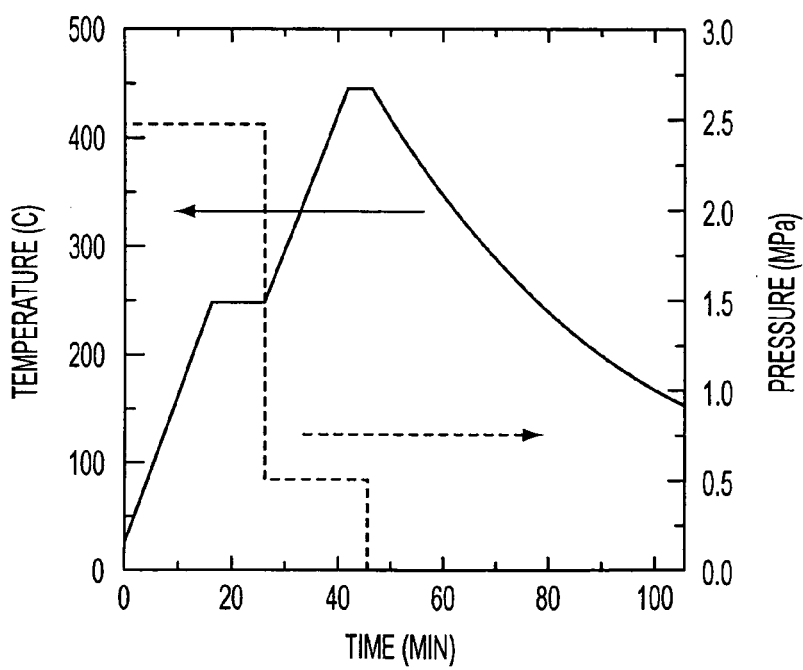
FIG. 10 is a graph of a wafer bonding temperature-pressure curve as a function of time as used in the bond annealing process.

Specifically, at lower temperatures prior to exfoliation, higher pressures can be employed to ensure better substrate-substrate contact, but these pressures would at higher temperatures subdue exfoliation. By reducing the pressure to a lower level prior to annealing to high temperatures, exfoliation is uninhibited.

a. Variable Pressure Cycle—One possible embodiment is to utilize independently varied pressure and temperature to optimize the bonding process. At low temperatures, high pressures are applied to strengthen the bond. At high temperatures the pressure is then reduced to avoid the suppression of layer exfoliation in the device substrate. A representative process is illustrated in the graph of FIG. 10 where the wafer bonding temperature-pressure curve is shown as a function of time in the bond annealing process.
  b. Single Pressure Cycle—The bonding process is also improved by applying a uni-axial load to the bonded pair for the duration of the anneal. In this process it is essential that the load be small enough to avoid the suppression of blistering.

8) Device Layer Modification

Figure 11A:
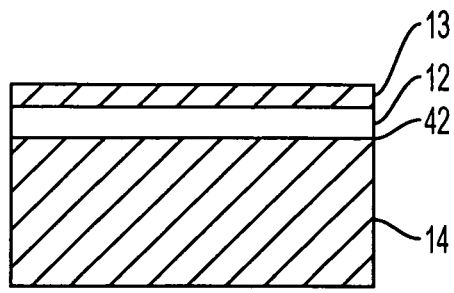
FIGS. 11a and 11b are diagrams illustrating respectively the wafer bonded virtual substrate following the anneal and layer exfoliation and the wafer bonded virtual substrate following a damage removal etch, polish or epitaxial growth on the device film.
Figure 11B:
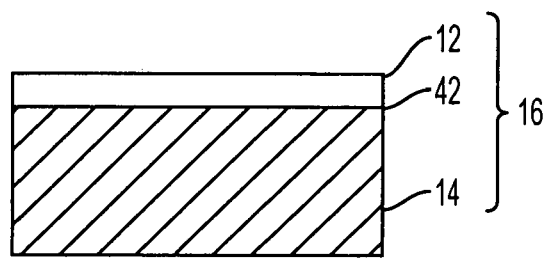
Figure 12A:
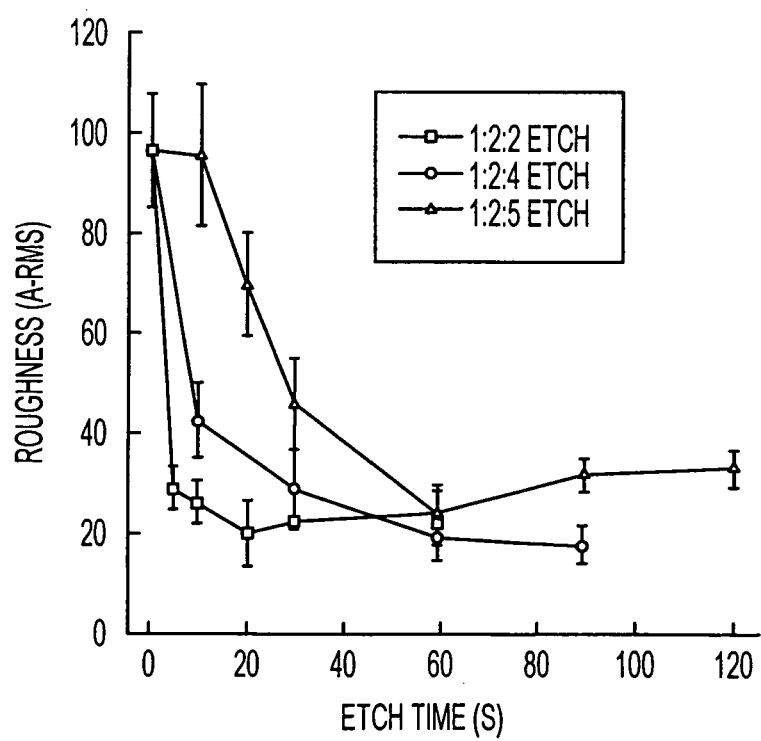
FIG. 12a is a graph of the rms surface roughness of a transferred InP device film as a function of time for 1:2:2, 1:2:4, and 1:2:5 dilutions of the $HCl:H_3PO_4:H_2O_2$ etch chemistry.
Figure 12B:
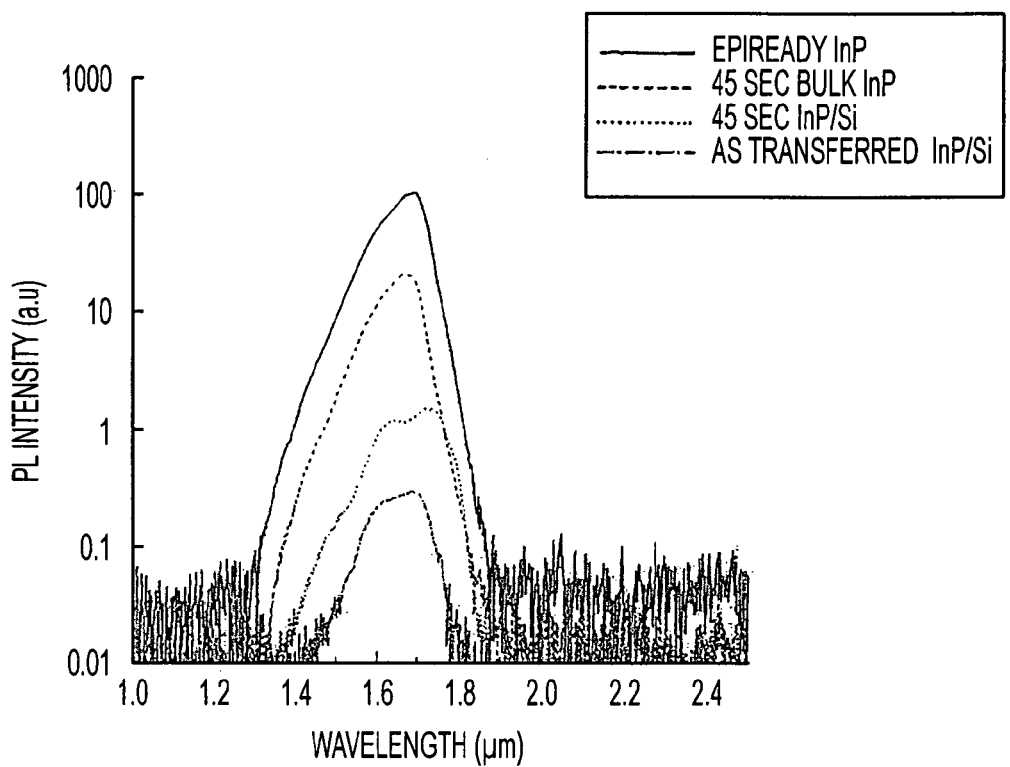
FIG. 12b is a graph of the photoluminescence intensity (PL) of InP/InGaAs/InP double heterostructures grown on InP/Si heterostructures etched in 1:2:2 $HCl:H_3PO_4:H_2O_2$ wet chemical etchant for Epi-ready InP as conventionally supplied for epitaxial growth, and bulk InP polished for 45 seconds, InP/Si polished for 45 seconds and as transferred InP, which is the wafer bonded structure following layer transfer and prior to any surface modification. The increased intensity with polishing of the InP/Si virtual substrate illustrates the improved surface quality of the treated structure.
Figure 12C:
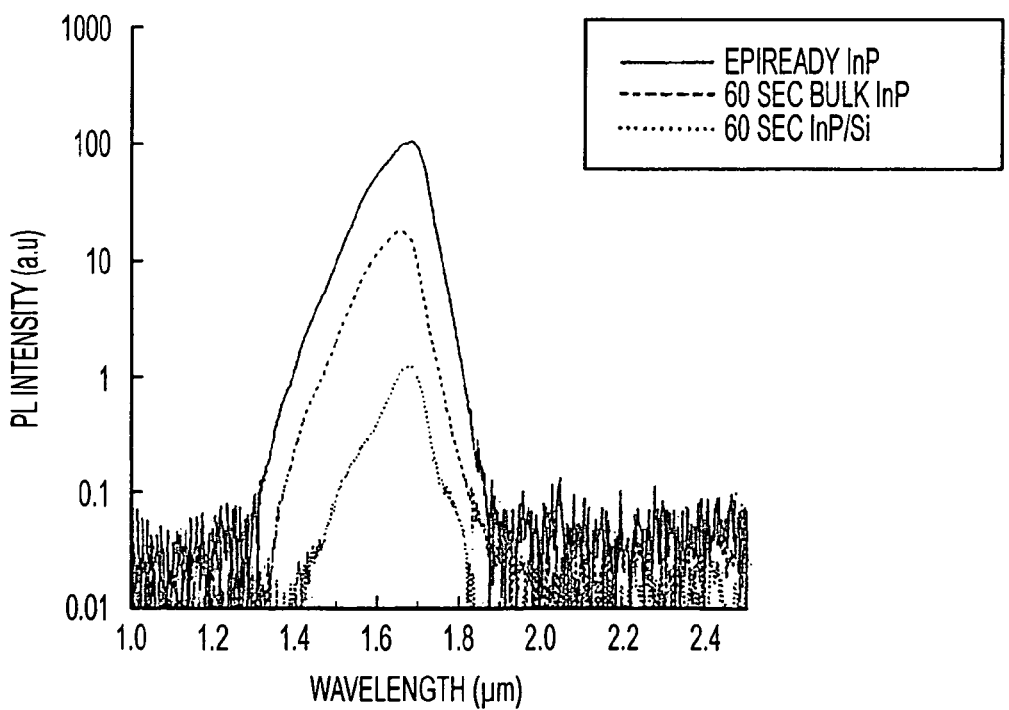
FIG. 12c is a graph of the photoluminescence intensity (PL) of InP/InGaAs/InP double heterostructures grown on InP/Si heterostructures etched in 1:2:4 $HCl:H_3PO_4:H_2O_2$ wet chemical etchant for Epi-ready InP as conventionally supplied for epitaxial growth, and bulk InP polished for 60 seconds, and InP/Si polished for 60 seconds. The increased intensity with polishing of the InP/Si virtual substrate illustrates the improved surface quality of the treated structure.
Figure 12D:
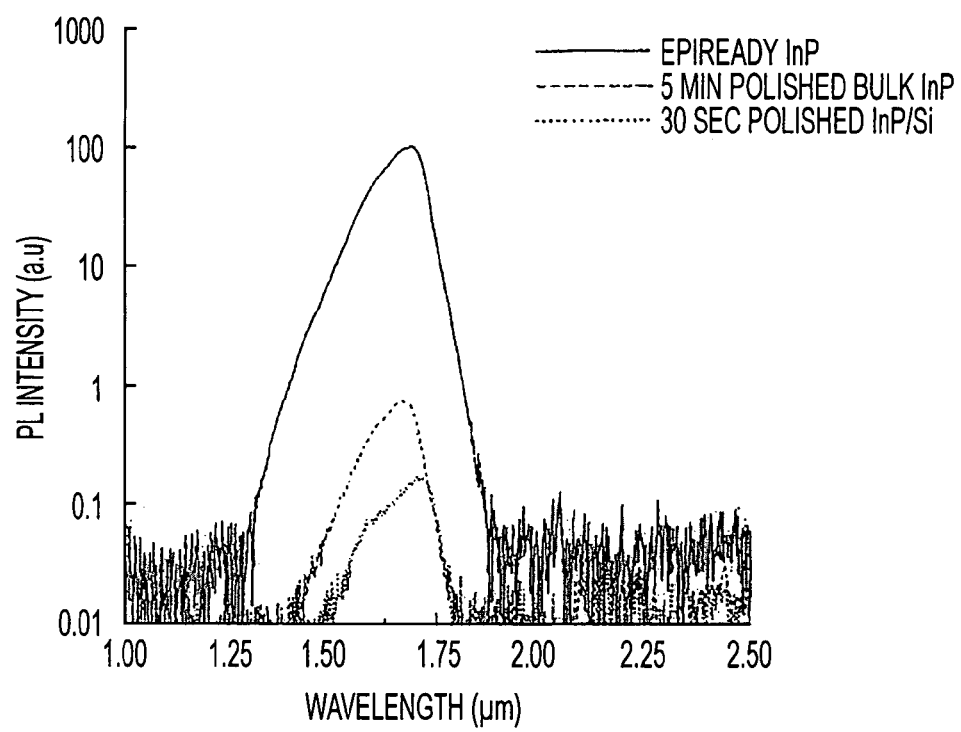
FIG. 12d is a graph of the photoluminescence intensity (PL) of InP/InGaAs/InP double heterostructures grown on InP/Si heterostructures treated with a sodium hypochlorite chemical mechanical polishing process for Epi-ready InP as conventionally supplied for epitaxial growth, and bulk InP polished for 5 minutes, and InP/Si polished for 30 seconds. The increased intensity with polishing of the InP/Si virtual substrate illustrates the improved surface quality of the treated structure.
Figure 12E:
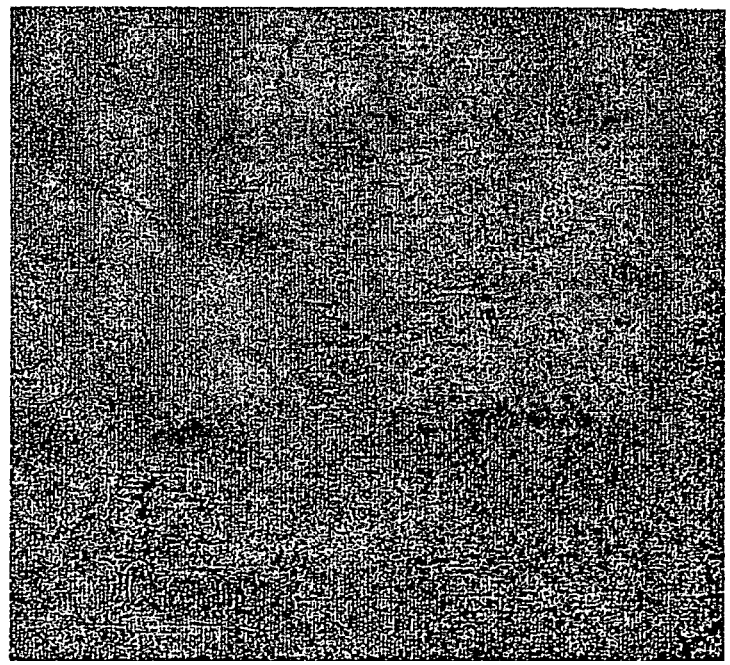
FIG. 12e is a atomic force microphotograph of the surface of a transferred InP device film following a 30 second chemical mechanical polishing process.

Following the transfer of the device film in the ion implantation induced layer transfer process, the near surface region of the device film 12 is both rough and defect rich. This layer must be controllably removed to leave a surface that is useful for subsequent processing to fabricate an optoelectronic device as shown in FIGS. 11a and 11b. Depending on the device layer 10 this can be accomplished by:

a. Wet Chemical Polishing—This process uses a device-film-dependent etch to controllably remove the ion implantation induced damage layer 13 of the wafer bonded virtual substrate 16, while simultaneously smoothing the surface of the transferred layer. Etches for specific materials are given below.
    1. Ge/Si:
      i. $HF:H_2O_2:H_2O$—This etch can be performed at various dilution ratios x:y:z at various temperatures.
      ii. $HF:HNO_3:C_2H_4O_2:H_2O$—This etch can be performed at various dilution ratios w:x:y:z at various temperatures.
      iii. $H_2O_2:H_2O$—This etch can be performed at various dilution ratios y:z at various temperatures.
    2. InP/Si:
      i. $HCl:H_3PO_4:H_2O_2$—This etching solution has been successfully used in ratios of 1:2:2 and 1:2:4. The $H_2O_2$ acts as an oxidizing agent and the mixture of HCl and $H_3PO_4$ etches the oxide. The combination of oxidation followed by etching creates a smoothened surface and removes the implantation damage. FIG. 12a is a graph which shows both the surface roughness as a function of time for various etch dilutions. FIGS. 12b and 12c show photoluminescence spectra of InP/InGaAs/InP double heterostructures epitaxially grown on InP/Si virtual substrates exposed to 1:2:2 and 1:2:4 etch dilutions respectively. The relative increase of luminescent intensity of the chemically treated structures indicates that the process yields an improved surface for epitaxy. In FIG. 12b The spectrum corresponding to the epi-ready InP is taken from a double heterostructure grown an epi-ready InP substrate available from a bulk substrate manufacturer. The 45 second bulk InP spectrum is taken from a double heterostructure grown on an epi-ready InP substrate that has been exposed to the chemical treatment for 45 seconds. The 45 second InP/Si spectrum is taken from a double heterostructure grown on a wafer bonded virtual InP/Si sample that has been chemically treated following layer transfer. The As-transferred InP/Si spectrum is taken from a double heterostructure that was grown on an InP/Si wafer bonded structure following layer exfoliation but without surface treatment. In FIG. 12c the spectrum corresponding to the epi-ready InP is taken from a double heterostructure grown an epi-ready InP substrate available from a bulk substrate manufacturer. The 60 second bulk InP spectrum is taken from a double heterostructure grown on an epi-ready InP substrate that has been exposed to the chemical treatment for 60 seconds. The 60 second InP/Si spectrum is taken from a double heterostructure grown on a wafer bonded virtual InP/Si sample that has been chemically treated for 60 seconds following layer transfer.

b. Chemical and mechanical Polishing—This utilizes both a chemical and a mechanical slurry to etch through implantation damage and leave a smooth surface.
  1. Ge/Si—A colloidal silica slurry in a KOH chemistry can be used to polish the substrate.
  2. InP/Si—A colloidal silica slurry in a sodium hypochlorite solution has been shown to smooth the surface of these virtual substrate materials. FIG. 12d shows photoluminescence spectra of InP/InGaAs/InP double heterostructures epitaxially grown on InP/Si virtual substrates treated with a chemical and mechanical polish process. In FIG. 12d the spectrum corresponding to the epi-ready InP is taken from a double heterostructure grown an epi-ready InP substrate available from a bulk substrate manufacturer. The 5 min bulk InP spectrum is taken from a double heterostructure on an epi-ready InP substrate that has been exposed to the polish treatment for five minutes. The 30 second InP/Si spectrum is taken from a double heterostructure grown on a wafer bonded virtual InP/Si sample that has been polished for 30 seconds following layer transfer. The increase in photoluminescence intensity of the polished virtual substrate relative to an unpolished virtual substrate indicates an improved surface for epitaxy. The surface roughness is reduced to about 3 nm rms in the process an atomic force microscopy scan of which is shown in FIG. 12e.

Homoepitaxial Smoothing—Even in circumstances when chemical etching removes the implantation damage, but doesn't leave an optimally smooth surface for subsequent heteroepitaxy, homoepitaxy of the device film material on the etched sample has been shown to reduce surface roughness. This can be performed as the first step in the growth of a heteroepitaxial structure on the wafer bonded virtual substrate.

9) Epitaxial Heterostructure Growth

Figure 13A:
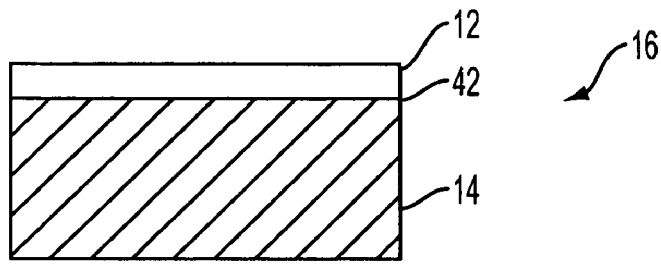
FIGS. 13a and 13b are diagrams illustrating respectively the completed wafer bonded virtual substrate and a wafer bonded virtual substrate with an epitaxially grown device fabricated on the device thin film.
Figure 13B:
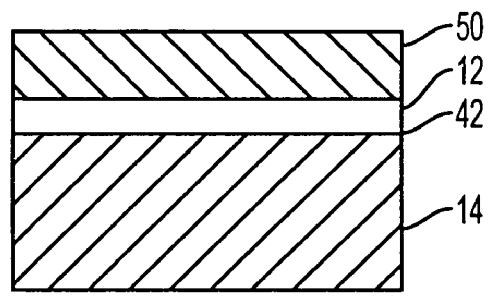

The finished virtual substrate 16 is meant to serve as a template for growth of an optoelectronic device through hetero-epitaxy. Through careful device layer modification, epitaxy of a wide range of optoelectronic devices is made possible. A representative image of such a structure is shown in FIGS. 13a and 13b. FIG. 13a is a diagram which shows the completed wafer bonded virtual substrate 16 comprised of a thin device film 12, a wafer bonded interface 42 and a handle substrate 14. FIG. 13b is a diagram which shows a wafer bonded virtual substrate 16 with an epitaxially grown device 50 fabricated on the device thin film 12.

10) Strain Compensation Layer

Figure 14:
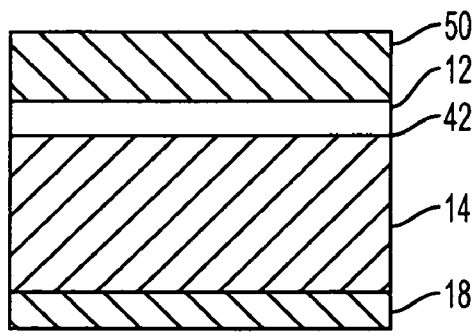
FIG. 14 is a diagram showing an optoelectronic structure grown on a wafer bonded virtual substrate consisting of the device film, the bonded interface, the handle substrate, and a strain compensation layer deposited on the back surface of the substrate.

One potential challenge in implementing wafer bonded virtual substrates in the fabrication of devices in or on the transferred layer by standard processing such as MOCVD, diffusion, implantation, and lithography is the possibility of wafer bow due to the presence of thermal expansion derived strain in the transferred layer. A practical approach to minimizing this effect would be to deposit a strain compensation layer on the back surface of the handle substrate 14 as shown in FIG. 14. FIG. 14 is a diagram which schematically shows an optoelectronic structure 50 grown on a wafer bonded virtual substrate 16 comprised of the device film 12, the bonded interface 42, the handle substrate 14, and a strain compensation layer 18 deposited on the back surface of the substrate.

This concept would be implemented by depositing a thin film 18 on the back surface of the handle substrate 14 either prior to or after the transfer of the device layer 10 to the handle substrate 14. The strain compensation layer 18 must have the same sign of $\Delta\alpha$ relative to the handle substrate as the device film 12. The zero bow condition is not a zero strain condition, but rather a condition in which the strain energy of the device film 12 and the strain compensation layer 18 are exactly matched providing no driving force for substrate deformation. The material and deposition technique can be chosen to minimize the fabrication cost associated with this processing step. The strain energy associated with a thin film 12 is increased with substrate diameter, film strain, and film thickness. The strain compensation layer material 18, deposition temperature, and thickness can be chosen to tailor the zero bow process temperature. The following are examples of how strain compensation could be performed for several materials systems:
  a. Ge/Si—The simplest case would be to deposit a film of Ge on the back surface of the Si handle substrate.
  b. InP/Si—Rather than deposit InP on the back of the handle, a thin film of Ge could be utilized because of its ease of deposition.
  c. GaAs/Si—As in the InP/Si case, Ge would make a good strain compensation layer.
  d. Other Materials—For all of the systems mentioned above, a low-cost material that is easily deposited is a suitable strain compensation layer, provided that the sign of $\Delta\alpha$ is appropriate.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method for forming a virtual substrate, comprising: (1) ion implanting a device substrate; (2) bonding the device substrate to a handle substrate; (3) removing a portion of the device substrate thereby leaving a device film bonded to the handle substrate; and (4) removing an upper portion of the device film, thereby leaving a smoother and less defect prone surface on the device film that is suitable for subsequent fabrication of optoelectronic devices;
   wherein the device and handle substrates are Ge and Si respectively;
   wherein removing an upper portion of the device film comprises chemically polishing the upper portion of the device film with a damage selective etch; and
   wherein chemically polishing the upper portion of the Ge film with a damage selective etch comprises etching with a mixture of $HF:H_2O_2:H_2O$ or a mixture of $HF:HNO_3:C_2H_4O_2$ or a mixture of $H_2O_2:H_2O$.

2. The method of claim 1 wherein chemically polishing the upper portion of the Ge film with a damage selective etch comprises etching with the mixture of $HF:H_2O_2:H_2O$.

3. The method of claim 1 wherein chemically polishing the upper portion of the Ge film with a damage selective etch comprises etching with mixture of $HF:HNO_3:C_2H_4O_2$.

4. The method of claim 1 wherein chemically polishing the upper portion with a damage selective etch comprises etching with the mixture of $H_2O_2:H_2O$.

5. A method for forming a virtual substrate, comprising: (1) ion implanting a device substrate; (2) bonding the device substrate to a handle substrate; (3) removing a portion of the device substrate thereby leaving a device film bonded to the handle substrate; and (4) removing an upper portion of the device film, thereby leaving a smoother and less defect prone surface on the device film that is suitable for subsequent fabrication of optoelectronic devices;
   wherein removing an upper portion of the device film comprises chemically polishing the upper portion of the device film with a damage selective etch; and
   wherein the device and handle substrates are InP and Si respectively and wherein chemically polishing the upper portion with a damage selective etch comprises etching with a mixture of $HCl:H_3PO_4:H_2O_2$.

6. A method for forming a virtual substrate, comprising: (1) ion implanting a device substrate; (2) bonding the device substrate to a handle substrate; (3) removing a portion of the device substrate thereby leaving a device film bonded to the handle substrate; and (4) removing an upper portion of the device film, thereby leaving a smoother and less defect prone surface on the device film that is suitable for subsequent fabrication of optoelectronic devices;
   wherein removing an upper portion of the device film comprises mechanically polishing the upper portion of the device film;
   wherein the device and handle substrates are Ge and Si respectively; and
   wherein mechanically polishing the upper portion of the device film comprises polishing using a colloidal silica slurry in a KOH solution.

7. A method for forming a virtual substrate, comprising: (1) ion implanting a device substrate; (2) bonding the device substrate to a handle substrate; (3) removing a portion of the device substrate thereby leaving a device film bonded to the handle substrate; and (4) removing an upper portion of the device film, thereby leaving a smoother and less defect prone surface on the device film that is suitable for subsequent fabrication of optoelectronic devices;
   wherein removing an upper portion of the device film comprises mechanically polishing the upper portion of the device film;
   wherein the device and handle substrates are InP and Si respectively; and
   wherein mechanically polishing the upper portion of the device film comprises polishing using a polishing solution comprising at least one of a colloidal silica slurry and a sodium hypochlorite solution.

8. A method for forming a virtual substrate, comprising: (1) ion implanting a device substrate; (2) bonding the device substrate to a handle substrate; (3) removing a portion of the device substrate thereby leaving a device film bonded to the handle substrate; and (4) removing an upper portion of the device film, thereby leaving a smoother and less defect prone surface on the device film that is suitable for subsequent fabrication of optoelectronic devices;

wherein the device film comprises a Ge, a Group II–VI, a Group III–V or a SiC semiconductor material or an oxide and the handle substrate comprises a Si or an insulating substrate.

9. The method of claim 8, wherein removing an upper portion of the device film comprises chemically polishing the upper portion of the device film with a damage selective etch.

10. The method of claim 8, wherein removing an upper portion of the device film comprises mechanically polishing the upper portion of the device film.

11. The method of claim 8, further comprising fabricating an optoelectronic device over the device film.

12. The method of claim 8 further comprising performing homoepitaxy on the device film to leave a smooth defect-free surface.

13. The method of claim 12 wherein the device film is germanium, the handle substrate is silicon, and the homoepitaxy material is germanium.

14. The method of claim 8, wherein the device film comprises a gallium nitride Group III–V semiconductor material.

15. The method of claim 14, wherein the handle substrate comprises a sapphire substrate.

16. The method of claim 14, wherein the handle substrate comprises the insulating substrate.

17. The method of claim 8, wherein the device film comprises the oxide.

18. The method of claim 17, wherein the oxide material comprises a metal oxide material and wherein the handle substrate comprises the insulating material.

19. A method for forming a virtual substrate, comprising: (1) ion implanting an oxide device substrate; (2) bonding the device substrate to a handle substrate; (3) removing a portion of the device substrate thereby leaving a device film bonded to the handle substrate; and (4) removing an upper portion of the device film, thereby leaving a smoother and less defect prone surface on the device film that is suitable for subsequent fabrication of optoelectronic devices;

wherein the device film comprises a metal oxide material and wherein the handle substrate comprises an insulating material.

20. A method for forming a virtual substrate, comprising: (1) ion implanting a gallium nitride device substrate; (2) bonding the device substrate to a handle substrate; (3) removing a portion of the device substrate thereby leaving a device film bonded to the handle substrate; and (4) removing an upper portion of the device film, thereby leaving a smoother and less defect prone surface on the device film that is suitable for subsequent fabrication of optoelectronic devices;

wherein the device film comprises gallium nitride.

21. The method of claim 20, wherein the handle substrate comprises an insulating material.

* * * * *